United States Patent [19]
Yamauchi

[11] Patent Number: 5,268,585
[45] Date of Patent: Dec. 7, 1993

[54] NON-VOLATILE MEMORY AND METHOD OF MANUFACTURING THE SAME

[75] Inventor: Yoshimitsu Yamauchi, Yamatokoriyama, Japan

[73] Assignee: Sharp Kabushiki Kaisha, Osaka, Japan

[21] Appl. No.: 896,010

[22] Filed: Jun. 9, 1992

Related U.S. Application Data

[63] Continuation-in-part of Ser. No. 744,499, Aug. 14, 1991, abandoned.

[30] Foreign Application Priority Data

Jul. 1, 1991 [JP] Japan ................................. 3-160692
Jul. 30, 1991 [JP] Japan ................................. 3-214533

[51] Int. Cl.$^5$ ..................... H01L 29/68; H01L 21/265
[52] U.S. Cl. ................................. 257/316; 257/321; 257/333; 257/390; 437/29; 437/40; 437/41; 437/48; 437/52; 437/63
[58] Field of Search ............. 257/316, 321, 333, 390; 437/29, 40, 41, 48, 52, 63

[56] References Cited

U.S. PATENT DOCUMENTS

| | | | |
|---|---|---|---|
| 4,882,707 | 11/1989 | Mizutani | 351/23.5 |
| 5,051,793 | 9/1991 | Wang | 357/23.5 |

FOREIGN PATENT DOCUMENTS

| | | |
|---|---|---|
| 0335395 | 10/1989 | European Pat. Off. . |
| 0386631 | 9/1990 | European Pat. Off. . |
| 0411573 | 2/1991 | European Pat. Off. . |

Primary Examiner—Edward Wojciechowicz
Attorney, Agent, or Firm—Nixon & Vanderhye

[57] ABSTRACT

A non-volatile memory comprises an auxiliary gate of polysilicon provided on a Si substrate having a gate insulating film and a field oxidation film; a floating gate which is provided on a side wall of the auxiliary gate lying in an active region with a small piece of a first insulating film interposed between them and which is formed by etchback of useless part of a polysilicon side wall spacer; and a control gate of polysilicon provided at least on the floating gate including a second insulating film interposed between them; the floating gate being formed in self-alignment to the control gate.

24 Claims, 13 Drawing Sheets

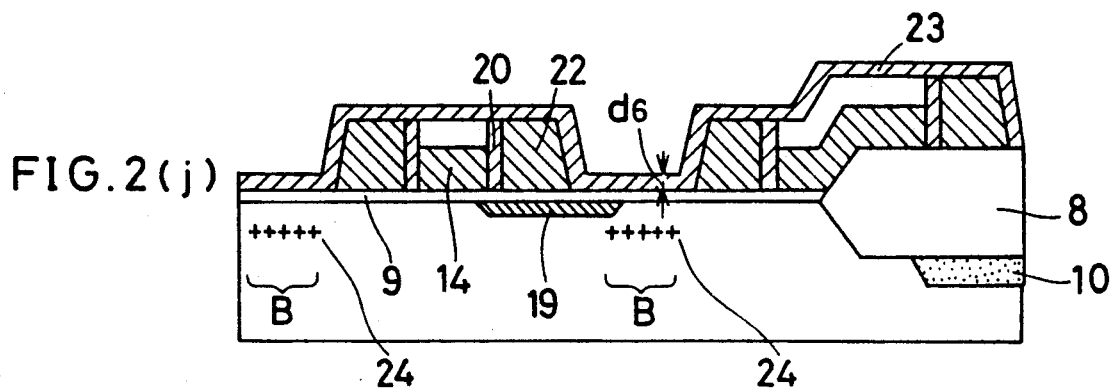
FIG.2(j)
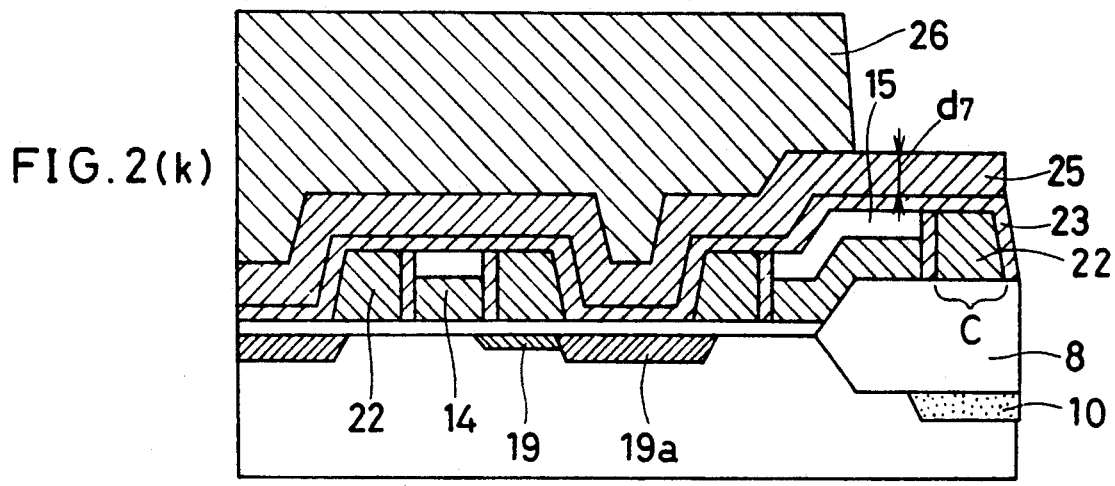
FIG.2(k)
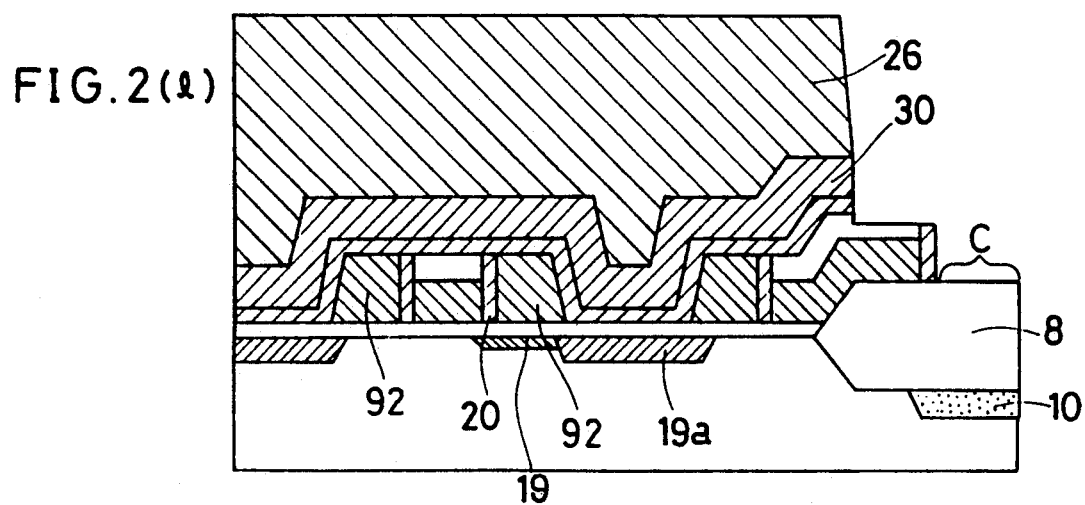
FIG.2(ℓ)

FIG. 3
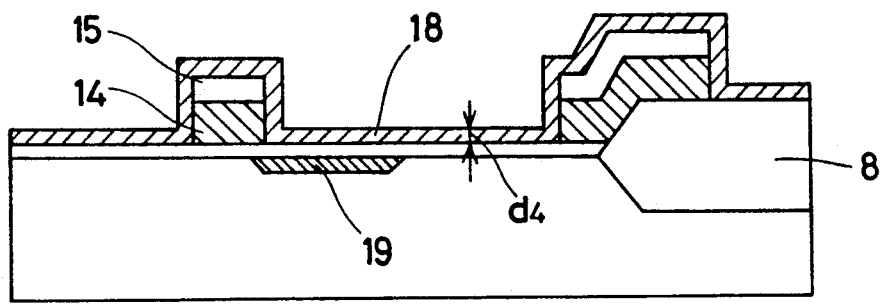
FIG. 3(f)
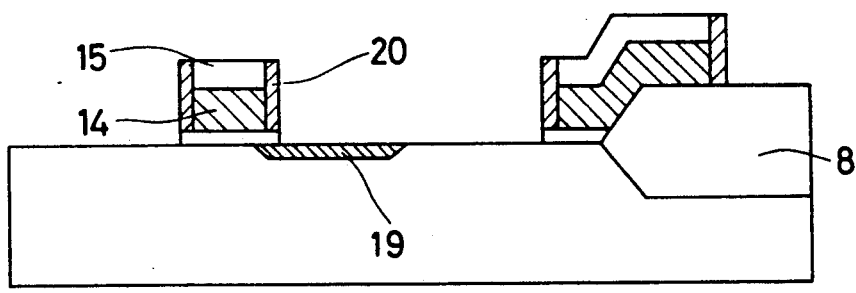
FIG. 3(g)
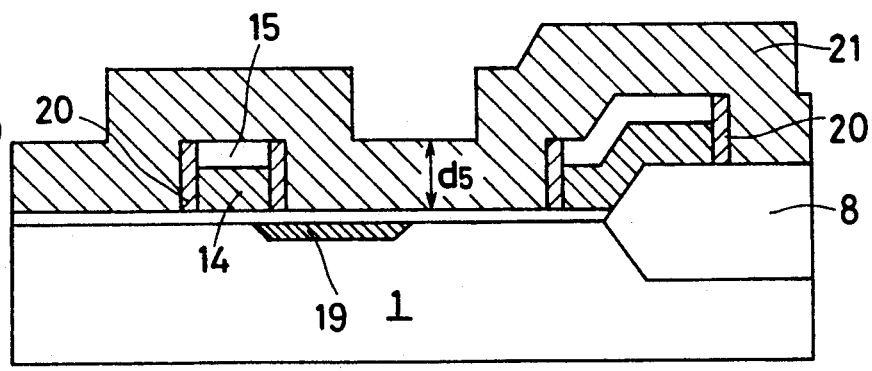
FIG. 3(h)

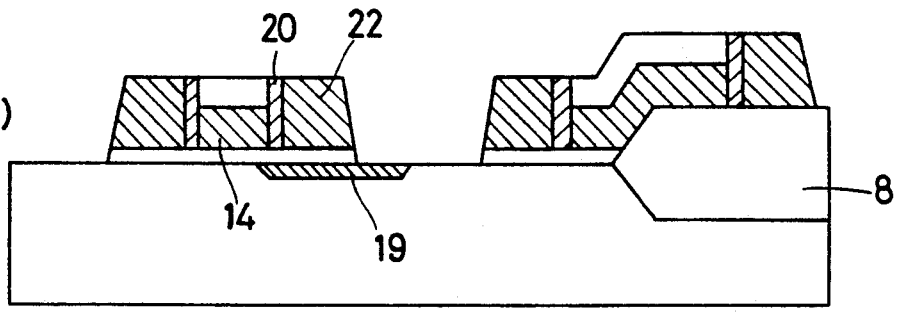
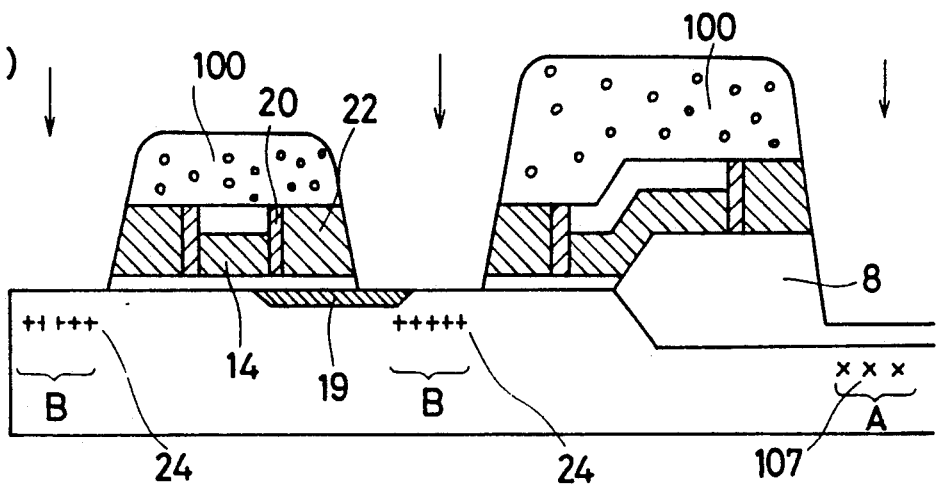
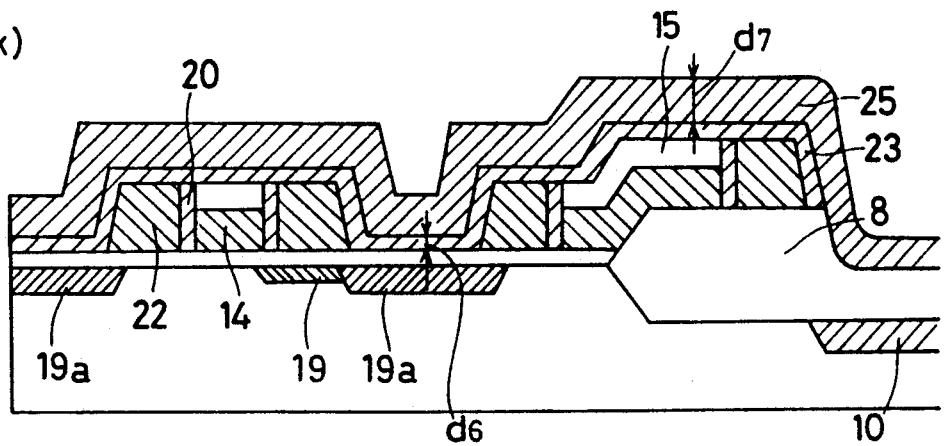

NON-VOLATILE MEMORY AND METHOD OF MANUFACTURING THE SAME

This application is a continuation-in-part application of U.S. patent application Ser. No. 07/744,499 filed Aug. 14, 1991 now abandoned.

BACKGROUND OF THE INVENTION

1. Field of the Invention

The present invention relates to a non-volatile memory which can be integrated on a large scale and a method of manufacturing the same, and more specifically, it relates to a flash memory in which writing can be performed with a single power source as low as 5 volts or less.

2. Description of the Prior Art

Since writing in a conventional flash memory is performed by hot electron injection from a drain side in a single transistor, writing is inefficient and approximately 1 mA of writing current is required. Hence, a flash memory cannot be achieved using a single power source of such low voltage (such as 5 volts or less) for writing.

To overcome the above-mentioned disadvantages, there has been proposed a memory cell having a split type configuration. However, such a cell is 1.5 to 2 times as large as a conventional cell in area and it is difficult to fabricate high density devices.

SUMMARY OF THE INVENTION

In accordance with the present invention, a non-volatile memory comprises an auxiliary gate of polysilicon provided on a Si substrate having a gate insulating film and a field oxidation film; a floating gate which is provided on a side wall of the auxiliary gate lying in an active region with a small piece of a first insulating film interposed between them and which is formed by etchback of useless part of a polysilicon side wall spacer; and a control gate of polysilicon provided at least on the floating gate including a second insulating film interposed between them; the floating gate being formed in self-alignment to the control gate.

Also, in another aspect of the present invention, a buried diffusion layer is provided just below the field oxidation film and serves as a bit line by which pairs of source and drain diffusion layers in memory cells are connected.

Moreover, the present invention is directed to a method of manufacturing a non-volatile memory comprising the steps of (a) forming an ion implantation layer in a field region on a Si substrate, forming a field oxidation film simultaneous with activating the ion implantation layer to convert it into a buried diffusion layer provided just below the field oxidation film, and then forming a gate insulating film on the Si substrate; (b) after depositing a first polysilicon layer over the entire surface of the Si substrate having a the gate insulating film and the field oxidation film, etching it to form an auxiliary gate in an active region and the field region; (c) forming, with a mask, an ion implantation layer on one side alone of the auxiliary gate in the active region, removing the mask, thereafter depositing a first insulating film over the entire surface of the Si substrate including the auxiliary gate, and activating the ion implantation layer formed on said side alone of the auxiliary gate to convert it into a source diffusion layer; (d) etching the first insulating film to form a small piece of the first insulating film on the auxiliary gate; (e) after depositing a second polysilicon layer over the entire surface of the Si substrate including the small piece of the first insulating film, etching it to form a side wall spacer in the active region and the field region; (f) after depositing a second insulating film over the entire surface of the Si substrate which has the auxiliary gate including the small piece of the first insulating film and the side wall spacer, forming an ion implantation layer on each side of the auxiliary gate in the active region, depositing a third polysilicon layer over the entire surface of the Si substrate which has the auxiliary gate including the small piece of the first insulating film and the side wall spacer, and activating the ion implantation layer formed on each side of the auxiliary gate in the active region and converting it into a drain diffusion layer so as to be directly connected to the source diffusion layer; and (g) etching away the third polysilicon layer and the side wall spacer on the field oxidation film to simultaneously form a control gate and a floating gate in self-alignment with each other, so that the control gate can lie on the floating gate with the second insulating film interposed between them, and forming a buried diffusion layer provided just below the field oxidation film and serving as a bit line by which pairs of source and drain diffusion layers in memory cells are connected.

Also, in another aspect of the present invention, a method of manufacturing a non-volatile memory comprises the steps of (a) forming a field oxidation film in a field region on a Si substrate, and forming a gate insulating film on the Si substrate; (b) after depositing a first polysilicon layer over the entire surface of the Si substrate having the field oxidation film, etching it to form an auxiliary gate in an active region and the field region; (c) forming, with a mask, an ion implantation layer on one side alone of the auxiliary gate in the active region, removing the mask, thereafter depositing a first insulating film over the entire surface of the Si substrate including the auxiliary gate, and activating the ion implantation layer formed on that side alone of the auxiliary gate to convert it into a source diffusion layer; (d) etching the first insulating film to form a small piece of the first insulating film on the auxiliary gate; (e) after depositing a second polysilicon layer over the entire surface of the Si substrate including the small piece of the first insulating film, etching it to form a side wall spacer in the active region and the field region; (f) after forming a resist pattern on the auxiliary gate and the side wall spacer, partially removing the field oxidation film to an extent that impurity ions can be implanted in a surface of the Si substrate; (g) forming an ion implantation layer on each side of the auxiliary gate in the active region, and simultaneously forming an ion implantation layer just below the remaining field oxidation film; (h) after removing the resist pattern, depositing a second insulating film over the entire surface of the Si substrate which has the auxiliary gate including the small piece of the first insulating film and the side wall spacer, depositing a third polysilicon layer over the entire surface of the Si substrate, activating the ion implantation layer formed on each side of the auxiliary gate in the active region and converting it into a drain diffusion layer, and simultaneously activating the ion implantation layer formed just below the field oxidation film to convert it into a buried diffusion layer just below the field oxidation film; and (i) etching away the third polysilicon layer and the side wall spacer on the field oxidation film to simultaneously form a control gate and a floating gate in self-alignment with each other, so that the control gate can lie on the floating gate with the second insulating film interposed between them, and forming a buried diffusion layer provided just below the field oxidation film and serving as a bit line by which pairs of source and drain diffusion layers in memory cells are connected.

BRIEF DESCRIPTION OF THE DRAWINGS

FIGS. 3(a) to 3(k) are diagrams showing a second embodiment of the manufacturing method according to the present invention;

DETAILED DESCRIPTION OF THE PREFERRED EMBODIMENT

Figure 5A:
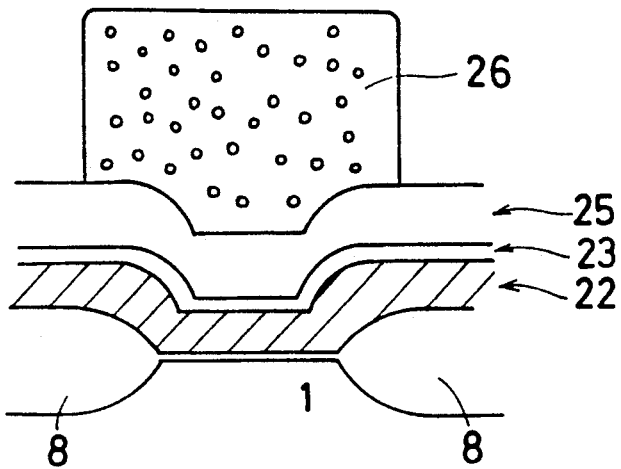
FIGS. 5a and 5b are diagrams showing a process according to the manufacturing method, seen from the position orthogonal to the line B-B' of FIG. 4.
Figure 5B:
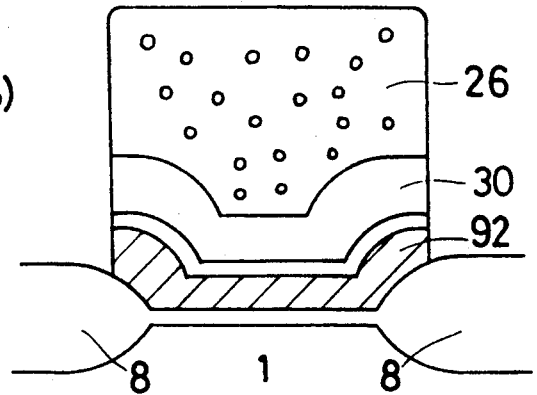

In the present invention, as shown in FIGS. 5(a) and 5(b), simultaneous with etching to form a control gate (abbreviated as "CG" in this embodiment) 30, a side wall spacer 22 (see FIG. 2(k)) is etched so as to be contiguous to a side wall of an auxiliary gate (abbreviated as "AG" hereinafter) 14 [self-aligning], and also a floating gate (abbreviated as "FG") 92 is simultaneously formed. The FG 92 is formed in each of cells C1 and C2, isolated from each other. In other words, according to the present invention, the FG 92 can be formed in self-alignment with the AG 14 as well as the CG 30. Thus, a mask in forming the FG 92 is no longer required, and this makes a margin on a superimposition in masking useless.

Figure 2A:
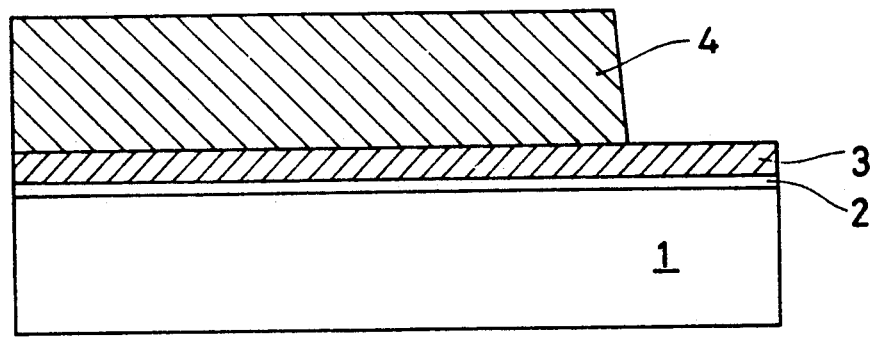
FIGS. 2(a) to 2(n) are diagrams showing a first embodiment of a manufacturing method according to the present invention.
Figure 3A:
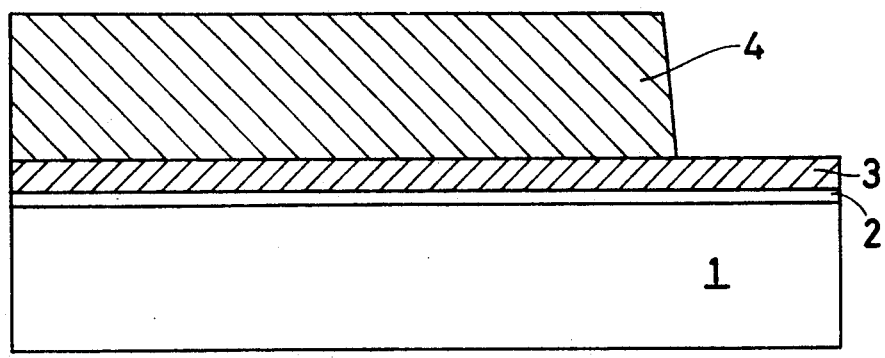
Figure 4:
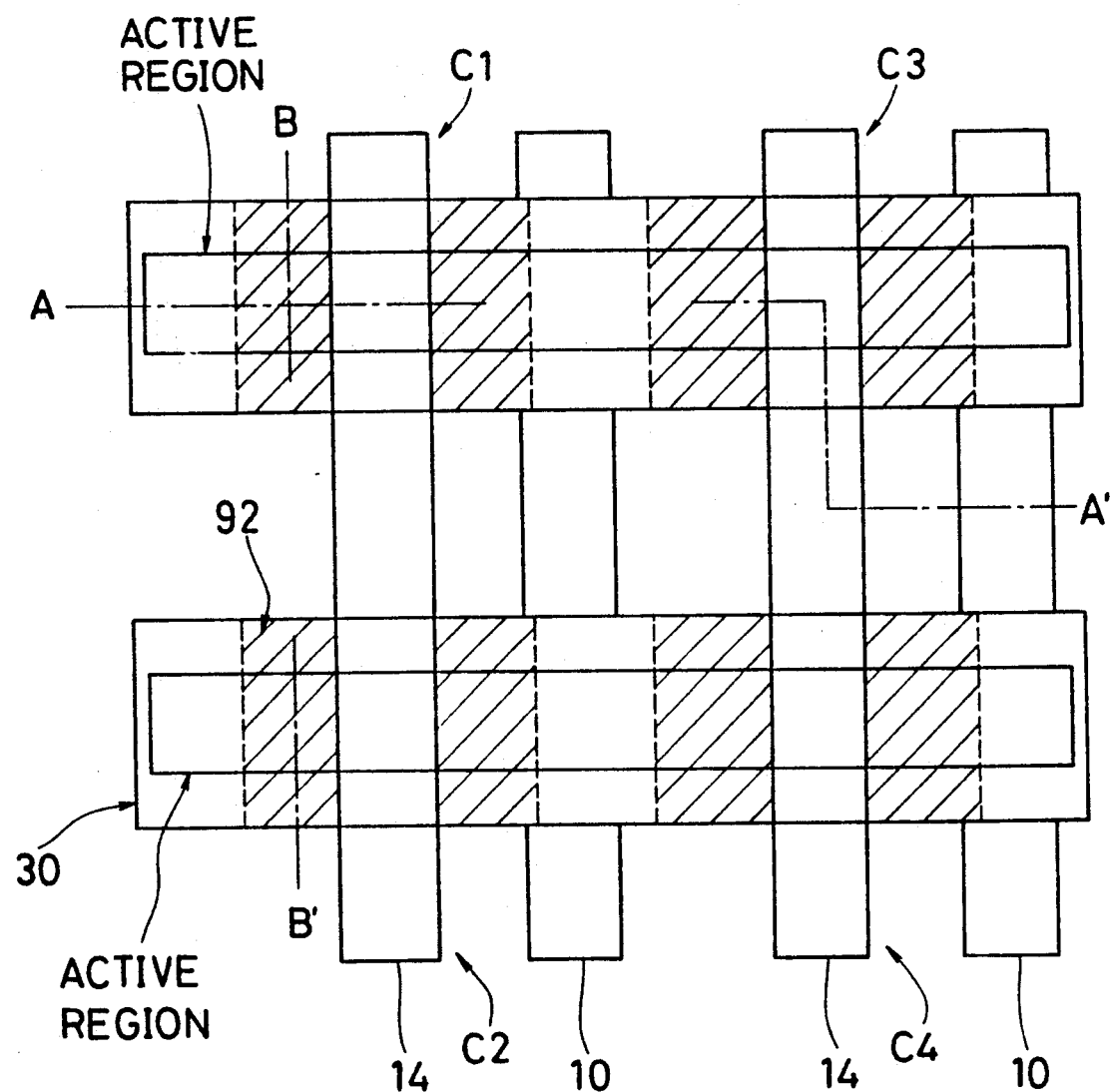
FIG. 4 is a plan view showing a non-volatile memory cell according to the present invention.

Also, in the present invention, as shown in FIG. 4, a buried diffusion layer 10 just below a field oxidation film 8 is employed for connecting source and drain diffusion layers 19, 19a (see FIG. 2(n)) in adjacent memory cells C1 and C2 and adjacent memory cells C3 and C4, and therefore, a Si substrate 1 in the buried diffusion layer 10 can be prevented from being dug when the CG 30 and the FG 92 are formed by etching. The formation of the buried layer 10 may be performed in either way as follows: (I) simultaneous with forming a field oxidation film after forming an ion implantation layer in a field region, or (II) after forming an ion implantation layer just below a region which is left after the field oxidation film is partially etched away. In the present invention, the buried diffusion layer 10 for connecting the drain diffusion layers 19a (the source diffusion layer 19 is directly connected to the drain diffusion layer 19a) in adjacent memory cells is formed just under the field oxidation film 8 so as not to be affected by the etching in forming the CG 30 and the FG 92 (see FIGS. 2(k) and 2(l)), or the field oxidation film 8 is left so as not to be affected by such etching in order to form the buried diffusion layer 10 (see FIGS. 3(j) and 3(k)).

Thus, a reduction of the size of the memory cells enables a reduction of the size of the chip, and the yield of chips can be enhanced. This makes this invention useful in the art.

The present invention will now be described in detail in conjunction with the preferred embodiments shown in the accompanying drawings. However, it is not intended that the present invention be limited to the precise form of the description.

Figure 2B:
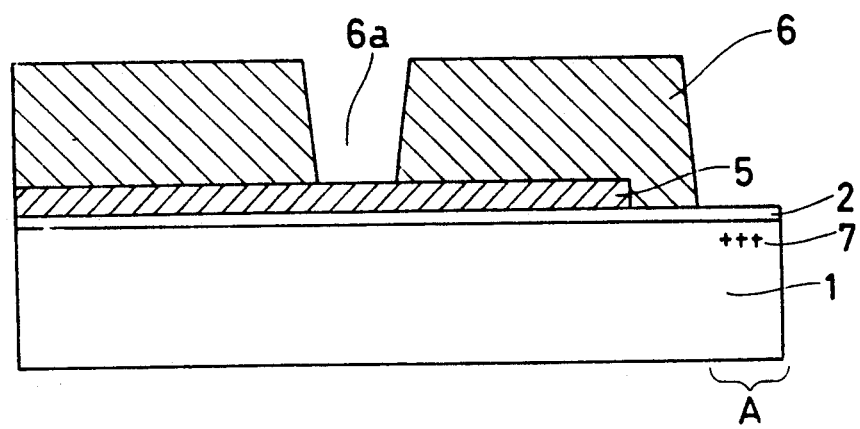
Figure 2C:
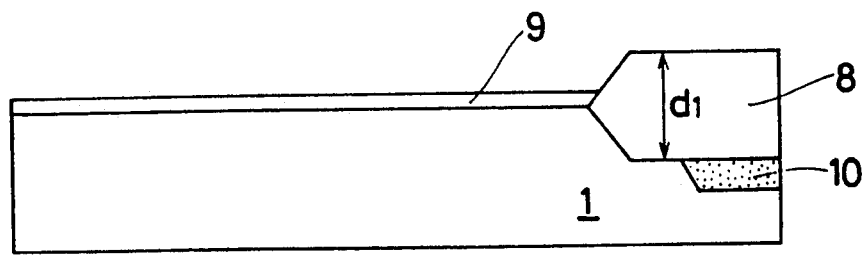
Figure 2D:
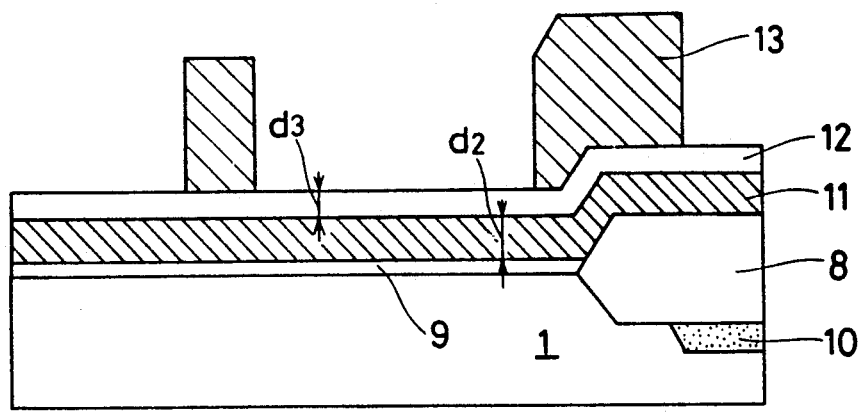
Figure 2E:
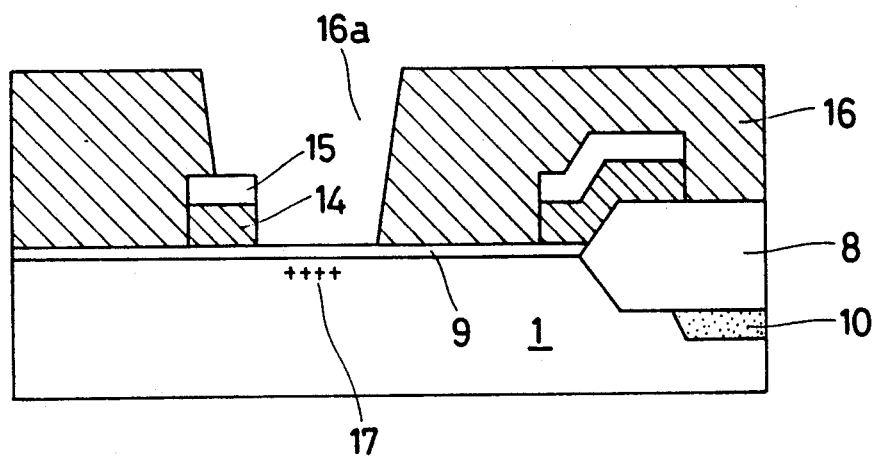
Figure 2F:
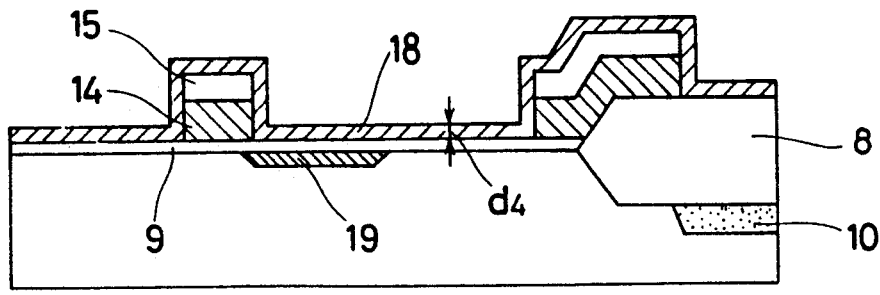
Figure 2G:
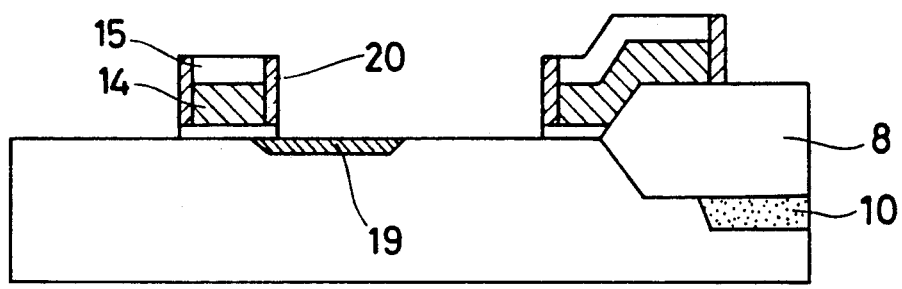
Figure 2H:
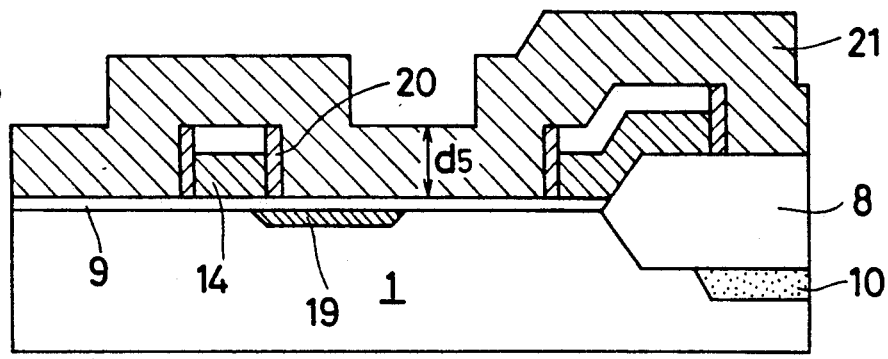
Figure 2I:
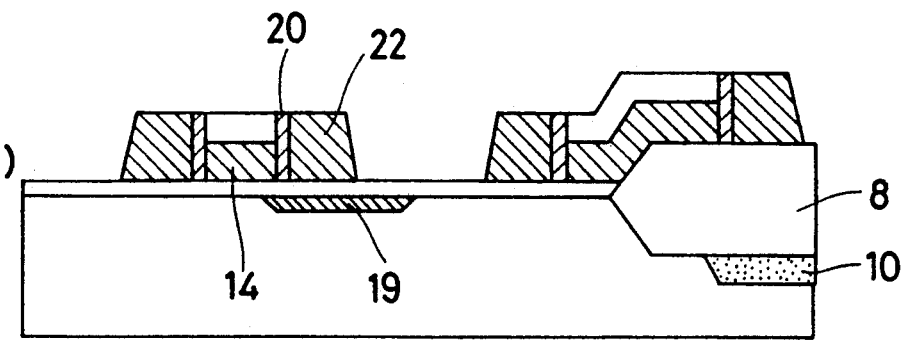
Figure 2M:
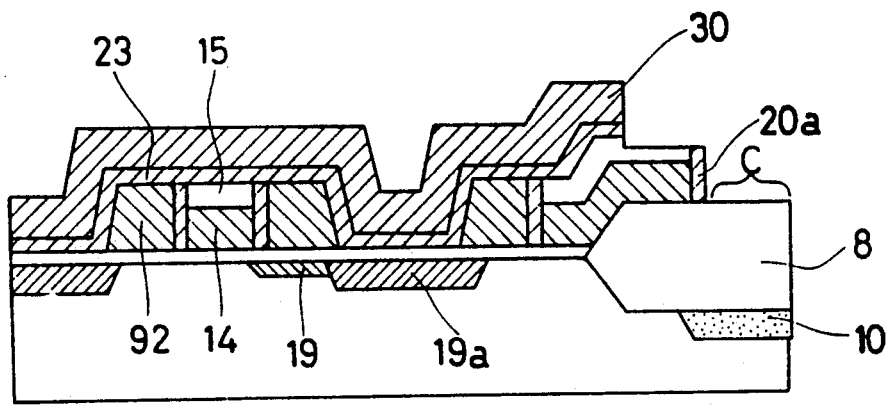
Figure 2N:
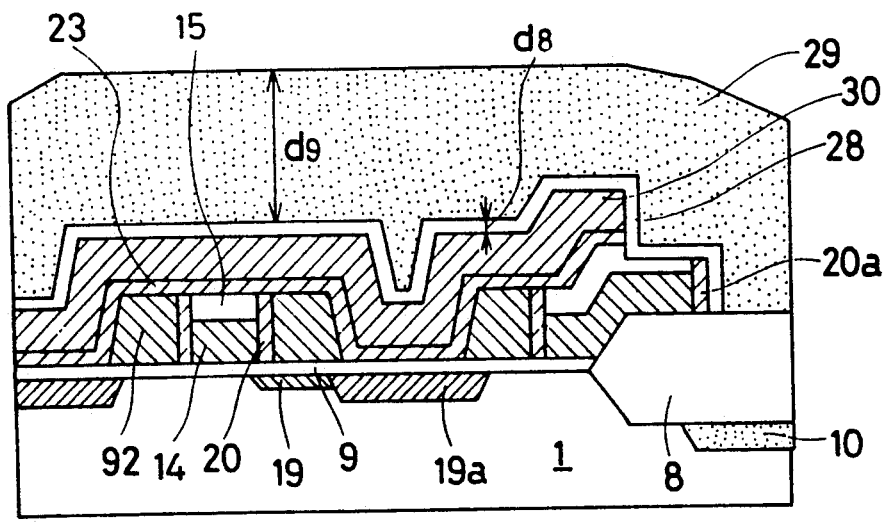

A flash memory cell where hot electrons are injected from a side of its source is, as shown in FIGS. 2(n) and 4, mainly composed of the FG 92, the CG 30 and AG 14.

The FG 92 is formed by etching away a needless portion of the polysilicon side wall spacer 22 which is provided on the side wall of the AG 14 with a small piece $SiO_2$ piece (small piece of a first insulating film) 20 interposed between them, and on the Si substrate 1 having the field oxidation film 8 and the gate insulating film 9, the source diffusion layer 19, the drain diffusion layer 19a directly connected to the source diffusion layer 19, the buried diffusion layer 10 just below the field oxidation film 8 and a gate oxidation film 9 are disposed, while the CG 30 is provided at least above the FG 92 through an ONO film of $SiO_2$—SiN—$SiO_2$ (a second insulating film) 23.

As shown in FIG. 4, pairs of the above-mentioned diffusion layers (19 and 19a) in the adjacent cells C1 and C2 are connected to each other by the buried diffusion layer 10. Also pairs of the above-mentioned diffusion layers (19, 19a) in the adjacent cells C3 and C4 are connected to each other by the buried diffusion layer 10.

As shown in FIG. 2(n), on the AG 14, a $SiO_2$ film 15 is provided. Over the CG 30, a BPSG film 29 is provided with a NSG film 28 interposed between them.

Now, a first manufacturing method according to the present invention will be described with reference to FIGS. 2(a) to 2(n).

Figure 1:
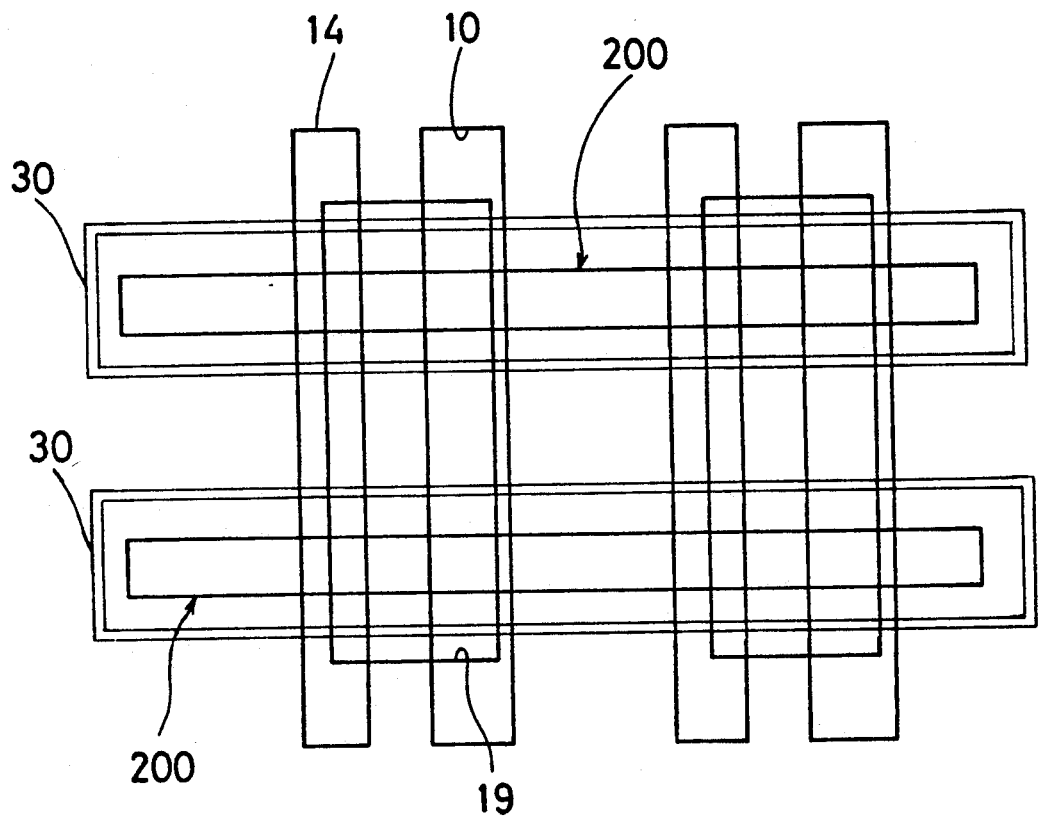
FIG. 1 is a diagram for explaining a layout arrangement of a non-volatile memory of an embodiment according to the present invention.

First, as shown in FIG. 2(a), a $SiO_2$ film 2 of 400 Å thickness is formed on the Si substrate 1 by a thermal oxidation method; thereafter, a SiN layer 3 of 1200 Å thickness and a resist layer are deposited on it, and a resist pattern 4 is formed to make a hole in the field region. The resist pattern 4 (corresponding to a portion other than the layout pattern 200 in FIG. 1) corresponds to a portion other than active regions in the layout pattern in FIG. 1.

Then, the SiN layer 3 is etched away using a mask of the resist pattern 4, and a SiN film 5 is exposed.

After the resist pattern 4 is removed, a resist pattern 6 (corresponding to the layout pattern in FIG. 1) for an ion implantation is further formed over the SiN film 5 and the $SiO_2$ film 2 (FIG. 2(b)). Then, in the memory cells C1 and C2 (see FIG. 4), arsenic (As) ions are implanted in a region A shown in FIG. 2(b) to form an ion implantation layer 7 (FIG. 2(b)) for forming the buried diffusion layer 10 which is to connect the pairs of the source and drain diffusion layers (19, 19a) in the cells C1 and C2. An acceleration energy is 40 Kev, and an amount of the implanted ions is $1 \times 10^{16}$ cm$^{-2}$.

At this time, as can be seen from the layout pattern 10 in FIG. 1, the resist pattern 6 has an opening 6a on the SiN film 5, however, no As ions are implanted into any region of the Si substrate 1 where the SiN film 5 and the $SiO_2$ film 2 lie.

Then, after the resist pattern 6 is removed, a $SiO_2$ filed oxidation film 8 having a thickness $d_1$ of 5000 Å is formed to isolate devices by a selective oxidation method.

At this time, the ion implantation layer 7 is activated by the above-mentioned thermal treatment in forming the field oxidation film 8 and converted into the buried diffusion layer 10 just below the field oxidation film 8.

After that, removing the SiN film 5 and the SiO$_2$ film 2, a gate oxidation film (gate insulating film) 9 is formed (see FIG. 2(c)).

Then, on the overall surface of the Si substrate 1 including the field oxidation film 8 and the gate oxidation film 9, a polysilicon layer (first polysilicon layer) 11 having a thickness d$_2$ of 2000 Å, a SiO$_2$ film (NSG film) 12 having a thickness d$_3$ of 2000 Å are deposited one after another. Furthermore, a resist layer is formed on it, and a resist pattern 13 (corresponding to the layout pattern in FIG. 1) is formed to form the AG 14 (see FIG. 2(d)).

Next, using a mask of the resist pattern 13, the SiO$_2$ film 12 and the polysilicon layer 11 are etched to form the AG 14 having the SiO$_2$ film 15 on its upper surface.

Then, a resist pattern 16 (corresponding to a layout pattern 19 in FIG. 1) for an ion implantation is formed for forming a source region in the Si substrate, and ions of As are implanted to form an N$^+$ ion implantation layer 17 (see FIG. 2(e)). At this time, the resist pattern 16 has an opening 16a in which a part of the AG 14 exists. The acceleration energy is 80 Kev while the amount of the implanted ions is $1 \times 10^{16}$ cm$^{-2}$.

After the resist pattern 16 is removed, a SiO$_2$ (NSG film) layer 18 having a thickness d$_4$ of 500 Å is formed over the entire surface of the Si substrate 1 including the AG 14 (see FIG. 2(f)).

Then, the SiO$_2$ layer 18 is etched back by reactive ion etching (RIE). Consequently, the small SiO$_2$ piece (small piece of the first insulating film) 20 is formed on the side wall of the AG 14 (see FIG. 2(g)). Instead of the small SiO$_2$ piece 20 as the first insulating film, an ONO film may be used which can be obtained by oxidizing the side wall of the AG 14 after the removal of the resist pattern 16, depositing a SiN layer, and then further oxidizing the SiN layer. Instead, a SiN layer alone may be used as the first insulating film.

Next, a polysilicon layer (second polysilicon layer) 21 having a thickness d$_5$ of 4000 Å is deposited over the entire surface of the Si substrate including the AG 14 with the small SiO$_2$ piece 20 (see FIG. 2(h)), and succeedingly, the polysilicon layer 21 is etched back by means of RIE to form the polysilicon side wall spacer 22 contiguous to the small SiO$_2$ piece 20 on the side wall of the AG 14 (see FIG. 2(i)).

Then, a SiN layer is formed over the entire surface of the Si substrate including the AG 14 where the small SiO$_2$ piece 20 and the side wall spacer 22 are provided after the oxidation of the side wall spacer 22, and the ONO layer 23 into which a surface of the SiN layer is converted by oxidation is formed having a thickness d$_6$ of 200 Å over the entire surface of the Si substrate so as to serve as the second insulating film (see FIG. 2(j)).

At this time, instead of the ONO layer 23, a SiN layer alone may be used as the second insulating film.

Then, with a mask of the AG 14 and the side wall spacer 22, As ions are implanted through the ONO layer 23 into the entire surface of the Si substrate including the AG 14 to form an ion implantation layer 24 in a region B. At this time, the acceleration energy is 80 Kev while the amount of the implanted ions is $1 \times 10^{15}$ cm$^{-2}$. Because of a succeeding thermal treatment, the ion implantation layer 24 serves as the drain diffusion layer 19a, which is directly connected to the source diffusion layer 19.

After that, a polysilicon layer having a thickness d$_7$ of 2000 Å (third polysilicon layer) 25 is deposited over the entire surface of the ONO layer 23 (see FIG. 2(k)).

Then, on the polysilicon layer 25, a resist pattern (corresponding to a layout pattern 30 in FIG. 1) 26 for forming the CG is formed (see FIGS. 2(k) and 5(a)).

Next, using a mask of the resist pattern 26, the CG 30 is formed by etching the polysilicon layer 25 (see FIG. 2(l)). Simultaneously, the side wall spacer 22 which lies on a field oxidation film region (see symbol C in FIG. 2(k)) is removed by etching with a mask of the resist pattern 26 and then the FG 92 is formed (see FIGS. 2(l) and 5(b)). FIG. 2(m) shows a preparation where the resist pattern 26 in FIG. 2(l) is removed. The CG 30 does not necessarily have to be formed on the AG 14; it may formed at least on the FG 92.

FIGS. 2(m) and 2(n) are sectional views taken along the line A-A' of FIG. 4 while FIGS. 5(a) and 5(b) are sectional views taken along the line B-B' of FIG. 4, and FIG. 5(a) corresponds to FIG. 2(k) while FIG. 5(b) corresponds to FIG. 2(l).

In this way, in the present invention, a needless portion of the side wall spacer 22 on the side wall of the AG 14 is etched away with the mask of the resist pattern 26 employed for forming the CG by etching, and the FG 92 is simultaneously formed, so that they can all be formed at the same time with a single mask.

Last, a NSG film 28 having a thickness d$_8$ of 1500 Å and serving as a layer insulating film is deposited over the entire surface, and a BPSG film 29 having a thickness d$_9$ of 8000 Å is deposited on the NSG film 28 (see FIG. 2(n)). At this time, a BPSG film may be used as a layer insulating film instead of the NSG film 28.

In this way, the intended memory cell can be fabricated.

The operation of the resultant memory cells will be explained below.

Figure 6:
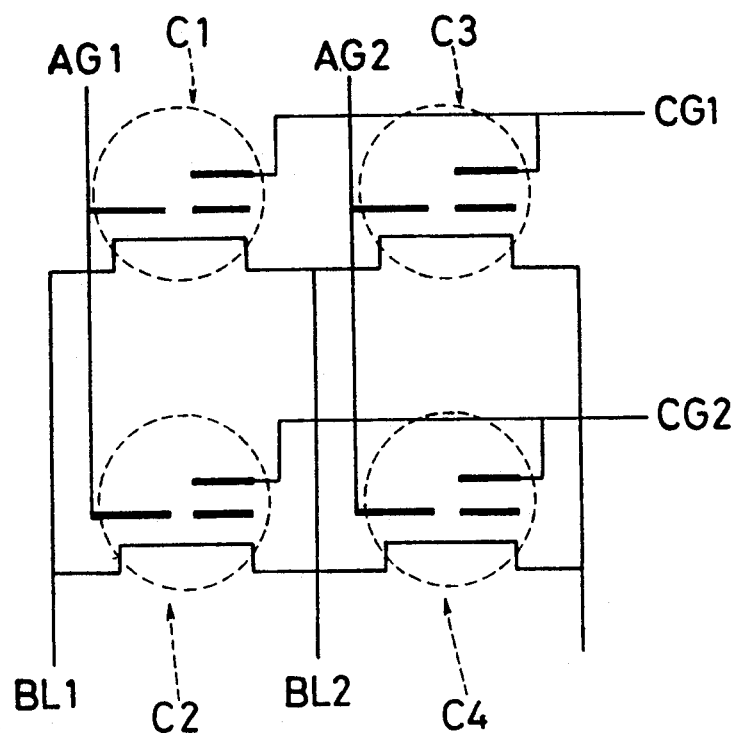
FIGS. 6 and 7 are an equivalent circuit diagrams of the non-volatile memory according to the present invention and an equivalent circuit diagram of the non-volatile memory cell.
Figure 7:
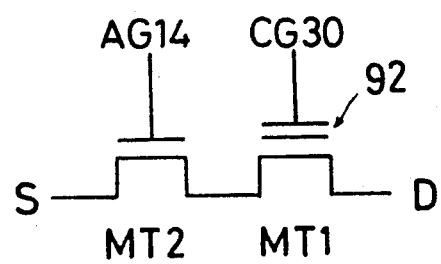

Referring to FIGS. 6 and 7, under the condition that an MT1 transistor is excessively reversed (high voltage is applied to the CG 30), voltage near the threshold voltage V$_{th}$ is applied to the AG 14, and as a result, an injection of hot electrons from the source side to the FG 92 enables writing.

TABLE 1

|  | BL1 | BL2 | CG1 | AG1 |
|---|---|---|---|---|
| WRITE | GND | 5V | 12V | 2V |
| ERASE | GND | 5V | −11V | GND |
| READ | GMD | 3V | 5V | 5V |

Thus, in this embodiment, the FG 92 can be formed by removing the needless portion of the side wall spacer on the side wall of the AG 14 with the same mask of the resist pattern 26 which is used in forming the CG 30 by etching, so that the resultant cell can be reduced in area. Moreover, since a buried diffusion layer as a bit line is formed just below a field oxidation film, the Si substrate 1 in the buried diffusion layer is not dug during the etching of the CG.

Then, with reference to FIGS. 3(a) to 3(k), a second manufacturing method according to the present invention will be described.

First, as shown in FIG. 3(a), a SiO$_2$ film 2 of 400 Å thickness is formed on a Si substrate 1 by thermal oxidation. After that, a SiN layer 3 of 1200 Å thickness and a resist layer are deposited on it, and a resist pattern 4 is formed to make a hole in a field region to form a field oxidation film.

Figure 3B:
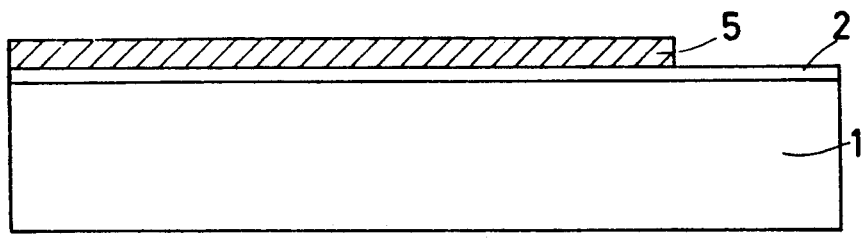
Figure 3C:
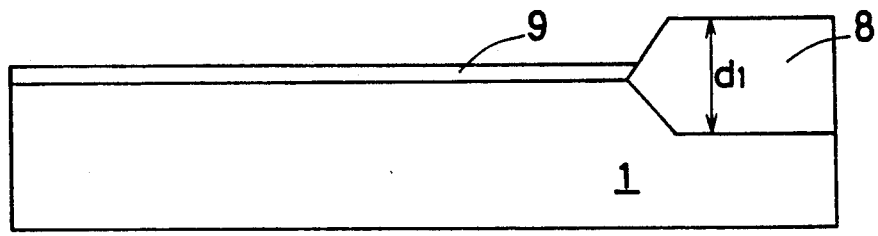
Figure 3D:
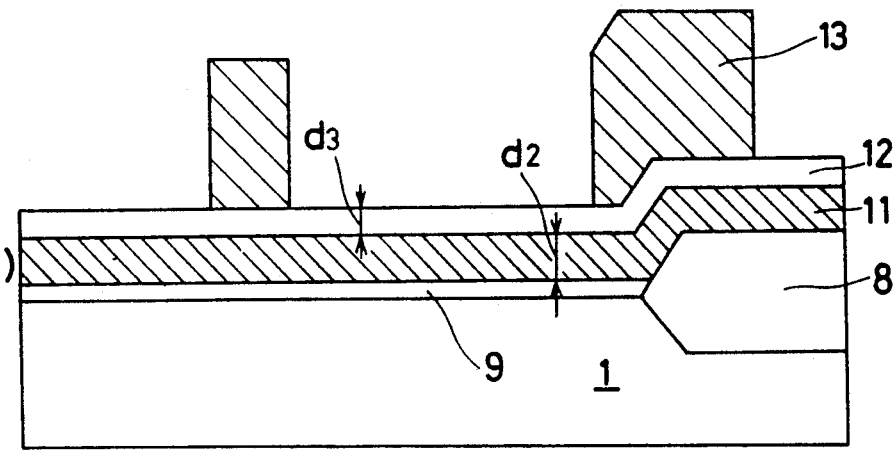

Then, the SiN layer 3 is etched away using a mask of the resist pattern 4 to expose the SiN film 5 (see FIG. 3(b)).

At this time, the SiO$_2$ film 2 is exposed in the field region.

After the resist pattern 4 is removed, the SiO$_2$ film 2 is removed, and then, a field oxidation film 8 of SiO$_2$ having a thickness of 5000 Å is formed by a selective oxidation method. After that, the SiN film 5 and the SiO$_2$ film 2 is removed, and a gate oxidation film (gate insulating film) 9 of SiO$_2$ is formed (see FIG. 3(c)).

Over the whole surface of the Si substrate 1 including the field oxidation film 8 and the gate oxidation film 9, a polysilicon layer (a first polysilicon layer) 11 having a thickness $d_2$ of 2000 Å, a SiO$_2$ film (NSG film) 12 having a thickness $d_3$ of 2000 Å are deposited one after another. Furthermore, a resist layer is deposited on it, and a resist pattern 13 (corresponding to the layout pattern 14 in FIG. 1) is formed to form the AG 14 (see FIG. 3(d)).

Next, using a mask of the resist pattern 13, the SiO$_2$ film 12 and the polysilicon layer 11 are etched to form the AG 14 having a SiO$_2$ film 15 on its upper surface.

Figure 3E:
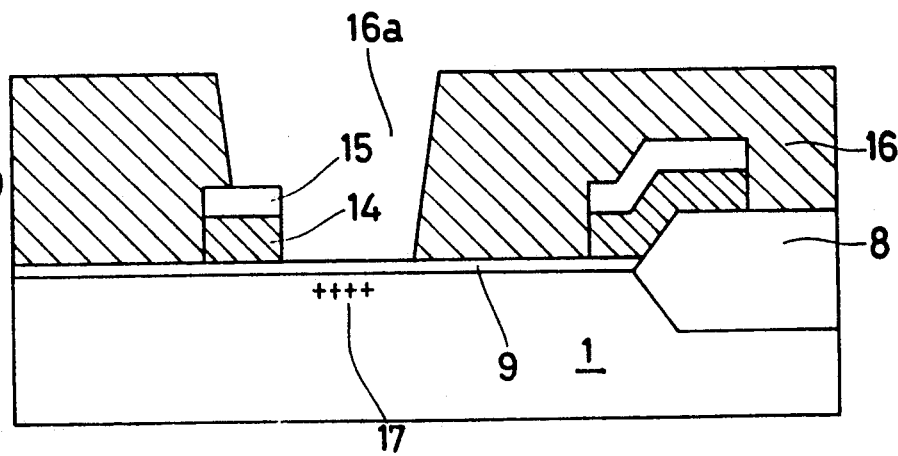

Then, a resist pattern 16 (corresponding to a layout pattern 19 in FIG. 1) for an ion implantation is formed for forming a source diffusion layer region in the Si substrate 1 including the AG 14, and ions of As are implanted to form an N$^+$ ion implantation layer 17 (see FIG. 3(e)). At this time, the resist pattern 16 has an opening 16a in which a part of the AG 14 exists. An acceleration energy is 80 Kev while an amount of the implanted ions is $1 \times 10^{15}$ cm$^{-2}$. The resultant N$^+$ ion implantation layer is later activated by a thermal treatment and converted into a source diffusion layer 19 (see FIG. 3(f)).

After the resist pattern 16 is removed, a SiO$_2$ (NSG) layer (a first insulating film) 18 having a thickness $d_4$ of 500 Å is formed over the entire surface of the Si substrate 1 including the AG 14 (see FIG. 3(f)). At this time, instead of the SiO$_2$ layer 18 serving as the first insulating film, an ONO film may be used which can be obtained by oxidizing the side wall of the AG 14 after the removal of the resist pattern 16, depositing a SiN layer, and further oxidizing the SiN layer. Instead, a SiN layer alone may be used as the first insulating film.

Then, the SiO$_2$ layer 18 is etched back by reactive ion etching (RIE). Consequently, a small SiO$_2$ piece (small piece of the first insulating film) 20 is formed on the side wall of the AG 14 (see FIG. 3(g)).

Next, a polysilicon layer (second polysilicon layer) 21 having a thickness $d_5$ of 4000 Å is deposited over the entire surface of the Si substrate including the AG 14 with the small SiO$_2$ piece 20 (see FIG. 3(h)), and succeedingly, the polysilicon layer 21 is etched back by means of RIE to form a polysilicon side wall spacer 22 contiguous to the small SiO$_2$ piece 20 on the side wall of the AG 14 (see FIG. 3(i)).

Then, as shown in FIG. 3(j), a resist pattern 100 is formed so as to cover the AG 14 where the small SiO$_2$ piece 20 and the polysilicon side wall spacer 22 are provided on its side wall, and with a mask of the resist pattern 100, the field oxidation film 8 originally having the 5000 Å thickness is etched by about 4500 Å.

After that, with a mask of the resist pattern 100, arsenic (As) ions are implanted into the whole surface of the Si substrate 1 to form an ion implantation layer 24 in a region B. The ion implantation layer 24 is activated by a thermal treatment performed later and converted into a drain diffusion layer 19a, which is directly connected to a source diffusion layer 19. At the same time, in a region C, an ion implantation layer 107 is formed. The ion implantation layer 107 is activated by a thermal treatment performed later and converted into a buried diffusion layer 10 serving as bit line for connecting pairs of the source and drain diffusion layers 19 and 19a in adjacent memory cells C1 and C2, and adjacent memory cells C3 and C4 (FIG. 4).

An acceleration energy in the ion implantation is 80 Kev while an amount of the implanted ions is $1 \times 10^{15}$ cm$^{-2}$ (FIG. 3(j)).

Then, after the side wall spacer 22 is oxidized, a SiN layer is formed over the entire surface of the Si substrate including the AG 14 where the small SiO$_2$ piece 20 and the side wall spacer 22 are provided, and an ONO layer 23 into which a surface of the SiN layer is converted by oxidation is formed having a thickness $d_6$ of 200 Å so as to serve as a second insulating film (see FIG. 3(k)).

At this time, instead of the ONO layer 23, a SiN layer alone may be used as the second insulating film.

After that, a polysilicon layer (third polysilicon layer) 25 having a thickness $d_7$ of 2000 Å is deposited over the whole surface of the SiN layer 23 (see FIG. 3(k)).

At this time, the ion implantation layer 107 is activated by a thermal treatment for forming the ONO layer 23 and the polysilicon layer (third polysilicon layer) 25 and converted into the buried diffusion layer 10 just under the piece of the field oxidation film. Simultaneously, the ion implantation layer 24 is activated and converted into the drain diffusion layer 19a.

Then, similar to FIG. 2(k), a resist pattern 26 (corresponding to the layout pattern 30 in FIG. 1) for forming the CG is formed on the polysilicon layer 25. The process steps thereafter are similar to those shown in FIGS. 2(k) to 2(n).

Thus, in this embodiment, in addition to the above-mentioned effects in the previous embodiment, the buried diffusion layer 10 can be formed simultaneous with the drain diffusion layer 19a, and a simplification of the process can be implemented.

As has been described, according to the present invention, with a mask of a resist pattern which is used in forming a control gate by etching, a part of a side wall spacer on an auxiliary gate which lies on a field oxidation film is simultaneously etched (i.e., they are self-aligned with each other), and therefore, an additional mask for forming a floating gate is needless. Thus, a margin required on a superimposition in masking becomes useless, and an area for a memory cell can be reduced. Such a reduction of the size of the memory cell leads to a reduction of the size of a chip, which, in turn, leads to an enhancement of a yield.

Since a buried diffusion layer just below a field oxidation film is used for connecting pairs of source and drain diffusion layers in adjacent memory cells, a Si substrate in the buried diffusion layer can be prevented from being dug in forming the control gate and the floating gate by etching. In this point, the present invention is useful in the art.

What is claimed is:

1. A non-volatile memory having a plurality of memory cells comprising:

an auxiliary gate of polysilicon provided on a Si substrate, the substrate having a gate insulating film formed thereon and a field oxidation film formed therein, the substrate further having a pair of source and drain regions formed therein;

a floating gate which is provided adjacent the auxiliary gate lying in an active region with a small piece of a first insulating film interposed therebetween;

a control gate of polysilicon provided at least on the floating gate including a second insulating film interposed between them; and a plurality of buried diffusion layers provided just below the field oxidation film, the buried diffusion layers being electrically connected to each of the source and drain diffusion regions, the buried diffusion layers serving as bit lines by which pairs of source and drain diffusion layers in memory cells are connected.

2. A non-volatile memory according to claim 1, wherein said first insulating film is a $SiO_2$ film, a SiN film, or a multi-stratum ONO film having a $SiO_2$—SiN—$SiO_2$ configuration.

3. A non-volatile memory according to claim 1, wherein said second insulating film is a multi-stratum ONO film having a $SiO_2$—SiN—$SiO_2$ configuration, or a SiN film.

4. A non-volatile memory according to claim 1, wherein said auxiliary gate and the control gate are orthogonal to each other in parallel with a surface of the Si substrate.

5. A method of manufacturing a non-volatile memory, comprising the steps of:
   (a) forming an ion implantation layer in a field region on a Si substrate, forming a field oxidation film simultaneous with activating the ion implantation layer to convert it into a buried diffusion layer provided just below the field oxidation film, and then forming a gate insulating film on the Si substrate;
   (b) after depositing a first polysilicon layer over the entire surface of the Si substrate having the gate insulating film and the field oxidation film, etching it to form an auxiliary gate in an active region and the field region;
   (c) forming, with a mask, an ion implantation layer on one side alone of the auxiliary gate in the active region, removing the mask, thereafter depositing a first insulating film over the entire surface of the Si substrate including the auxiliary gate, and activating the ion implantation layer formed on said side alone of the auxiliary gate to convert it into a source diffusion layer;
   (d) etching the first insulating film to form a small piece of the first insulating film on the auxiliary gate;
   (e) after depositing a second polysilicon layer over the entire surface of the Si substrate including the small piece of the first insulating film, etching it to form a side wall spacer in the active region and the field region;
   (f) after depositing a second insulating film over the entire surface of the Si substrate which has the auxiliary gate including the small piece of the first insulating film and the side wall spacer, forming an ion implantation layer on each side of the auxiliary gate in the active region, depositing a third polysilicon layer over the entire surface of the Si substrate which has the auxiliary gate including the small piece of the first insulating film and the side wall spacer, and activating the ion implantation layer formed on each side of the auxiliary gate in the active region and converting it into a drain diffusion layer so as to be directly connected to the source diffusion layer; and
   (g) etching away the third polysilicon layer and the side wall spacer on the field oxidation film to simultaneously form a control gate and a floating gate in self-alignment with each other, so that the control gate can lie on the floating gate with the second insulating film interposed between them, and forming a buried diffusion layer provided just below the field oxidation film and serving as a bit line by which pairs of source and drain diffusion layers in memory cells are connected.

6. A method of manufacturing a non-volatile memory, comprising the steps of:
   (a) forming a field oxidation film in a field region on a Si substrate, and forming a gate insulating film on the Si substrate;
   (b) after depositing a first polysilicon layer over the entire surface of the Si substrate having the field oxidation film, etching it to form an auxiliary gate in an active region and the field region;
   (c) forming, with a mask, an ion implantation layer on one side alone of the auxiliary gate in the active region, removing the mask, thereafter depositing a first insulating film over the entire surface of the Si substrate including the auxiliary gate, and activating the ion implantation layer formed on that side alone of the auxiliary gate to convert it into a source diffusion layer;
   (d) etching the first insulating film to form a small piece of the first insulating film on the auxiliary gate;
   (e) after depositing a second polysilicon layer over the entire surface of the Si substrate including the small piece of the first insulating film, etching it to form a side wall spacer in the active region and the field region;
   (f) after forming a resist pattern on the auxiliary gate and the side wall spacer, partially removing the field oxidation film to an extent that impurity ions can be implanted in a surface of the Si substrate;
   (g) forming an ion implantation layer on each side of the auxiliary gate in the active region, and simultaneously forming an ion implantation layer just below the remaining field oxidation film;
   (h) after removing the resist pattern, depositing a second insulating film over the entire surface of the Si substrate which has the auxiliary gate including the small piece of the first insulating film and the side wall spacer, depositing a third polysilicon layer over the entire surface of the Si substrate, activating the ion implantation layer formed on each side of the auxiliary gate in the active region and converting it into a drain diffusion layer, and simultaneously activating the ion implantation layer formed just below the field oxidation film to convert it into a buried diffusion layer just below the field oxidation film; and
   (i) etching away the third polysilicon layer and the side wall spacer on the field oxidation film to simultaneously form a control gate and a floating gate in self-alignment with each other, so that the control gate can lie on the floating gate with the second insulating film interposed between them, and forming a buried diffusion layer provided just below the field oxidation film and serving as a bit line by which pairs of source and drain diffusion layers in memory cells are connected.

7. A method according to claim 5, wherein said first insulating film is a $SiO_2$ film, a SiN film, or a multi-stratum ONO film having a $SiO_2$—SiN—$SiO_2$ configuration.

8. A method according to claim 5, wherein said second insulating film is a multi-stratum ONO film having a $SiO_2$—SiN—$SiO_2$ configuration, or a SiN film.

9. A method according to claim 5, wherein said control gate is formed orthogonal to said auxiliary gate in parallel to a surface of the Si substrate.

10. A method of forming a non-volatile memory cell, the method comprising:
   (1) forming a field oxidation film in a substrate;
   (2) forming, from a first polysilicon layer, an auxiliary gate on the substrate and at least partially over the field oxidation film;
   (3) forming, from a second polysilicon layer, side wall spacers on two opposing sides of the auxiliary gate with respect to a first direction;
   (4) depositing a third polysilicon layer over at least the side wall spacers in a second direction perpendicular to the first direction for use in forming a control gate;
   (5) positioning a mask over the third polysilicon layer;
   (6) using the mask with respect to the first direction to remove a portion of the third polysilicon layer and to remove at least a portion of one of the side wall spacers;
   (7) using the mask with respect to the second direction to remove portions of the third polysilicon layer and the second polysilicon layer whereby edges of the control gate and at least one of the side wall spacers are aligned with respect to the second direction, at least a remaining one side wall spacers serving as a floating gate and a remaining portion of the third polysilicon layer serving as the control gate.

11. The method of claim 10, further comprising forming a bit line beneath the field oxidation film for connecting the cell to an adjacent memory cell.

12. The method of claim 10, wherein the bit line is formed by a buried diffusion layer.

13. The method of claim 10, further comprising forming source and drain regions in the substrate.

14. The method of claim 10, wherein the steps of the claim 10 are conducted in a step succession corresponding to step number, and wherein the source region is formed after step (2) and the drain region is formed after step (3).

15. The method of claim 10, further comprising providing a first insulation between the auxiliary gate and the side wall spacers.

16. The method of claim 15, wherein the first insulation is a film chosen from a group consisting of $SiO_2$ film, a SiN film, and a multi-stratum ONO film having a $SiO_2$—SiN—$SiO_2$ configuration.

17. The method of claim 10, further comprising providing at least a second insulation between the third polysilicon layer and the second polysilicon layer and the auxiliary gate.

18. The method of claim 17, wherein the second insulation is a film chosen from a group consisting of $SiO_2$ film, a SiN film, and a multi-stratum ONO film having a $SiO_2$—SiN—$SiO_2$ configuration.

19. A non-volatile memory cell comprising:
   a field oxidation film formed in a substrate;
   an auxiliary gate formed on the substrate and at least partially over the field oxidation film from a first polysilicon layer;
   a floating gate formed from a side wall spacer on at least one side of the auxiliary gate with respect to a first direction, the side wall spacer being formed from a second polysilicon layer;
   a first insulation film provided between the floating gate and the auxiliary gate;
   a control gate formed from a third polysilicon layer extending over at least the side wall spacer in a second direction perpendicular to the first direction;
   a second insulation film provided between the control gate and at least the side wall spacer; and
   wherein edges of the control gate and the floating gate are aligned in the second direction.

20. The apparatus of claim 19, further comprising a bit line formed beneath the field oxidation film for connecting the cell to an adjacent memory cell.

21. The apparatus of claim 19, further comprising source and drain regions formed in the substrate.

22. The apparatus of claim 19, wherein the first insulation is a film chosen from a group consisting of $SiO_2$ film, a SiN film, and a multi-stratum ONO film having a $SiO_2$—SiN—$SiO_2$ configuration.

23. The apparatus of claim 19, wherein the second insulation is a film chosen from a group consisting of $SiO_2$ film, a SiN film, and a multi-stratum ONO film having a $SiO_2$—SiN—$SiO_2$ configuration.

24. A method according to claim 5, wherein an antioxidation film is also formed on part of an ion implantation film in step (a).

* * * * *